(12) United States Patent
Lee

(10) Patent No.: US 11,881,473 B2
(45) Date of Patent: Jan. 23, 2024

(54) DISPLAY APPARATUS

(71) Applicant: Seoul Semiconductor Co., Ltd., Ansan-si (KR)

(72) Inventor: Chung Hoon Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 154 days.

(21) Appl. No.: 17/143,089

(22) Filed: Jan. 6, 2021

(65) Prior Publication Data

US 2021/0217740 A1  Jul. 15, 2021

Related U.S. Application Data

(60) Provisional application No. 62/958,879, filed on Jan. 9, 2020.

(51) Int. Cl.
| | | |
|---|---|---|
| *H01L 25/13* | (2006.01) | |
| *H01L 33/62* | (2010.01) | |
| *H01L 33/00* | (2010.01) | |
| *H01L 25/00* | (2006.01) | |
| *H01L 27/12* | (2006.01) | |

(52) U.S. Cl.
CPC .............. *H01L 25/13* (2013.01); *H01L 25/50* (2013.01); *H01L 27/1259* (2013.01); *H01L 33/005* (2013.01); *H01L 33/62* (2013.01); *H01L 2933/0066* (2013.01)

(58) Field of Classification Search
CPC ........... H01L 33/005; H01L 2933/0066; H01L 27/124; H01L 27/3244; H01L 25/50; H01L 27/1259; H01L 27/3276; H01L 25/13; H01L 33/62

See application file for complete search history.

(56) References Cited

U.S. PATENT DOCUMENTS

| | | | |
|---|---|---|---|
| 6,057,898 | A | 5/2000 | Itoh et al. |
| 9,711,586 | B2 | 7/2017 | Lee |
| 2009/0278162 | A1 | 11/2009 | Wang et al. |
| 2017/0140679 | A1* | 5/2017 | Tomoda ............... G09F 9/3026 |
| 2017/0286044 | A1 | 10/2017 | Kim et al. |

(Continued)

FOREIGN PATENT DOCUMENTS

| | | |
|---|---|---|
| EP | 3128503 | 2/2017 |
| KR | 10-2016-0074828 | 6/2016 |

(Continued)

OTHER PUBLICATIONS

Extended European Search Report dated Dec. 5, 2023, in corresponding European Patent Application No. 21738896.6.

*Primary Examiner* — Feifei Yeung Lopez
(74) *Attorney, Agent, or Firm* — Oblon, McClelland, Maier & Neustadt, L.L.P.

(57) ABSTRACT

A display apparatus including a plurality of display modules each including a module substrate and a plurality of light emitting devices mounted on the module substrate, and a support substrate on which the display modules are disposed and including conductive members, in which the module substrates includes a plurality of recesses depressed from at least one end surface of the module substrate, and connection electrodes formed in the recesses, and the light emitting devices are electrically connected to the conducive members of the support substrate through the connection electrodes.

11 Claims, 19 Drawing Sheets

(56) References Cited

U.S. PATENT DOCUMENTS

2020/0111771 A1\* 4/2020 Su .................... H01L 25/167
2021/0111162 A1 4/2021 Takeya et al.

FOREIGN PATENT DOCUMENTS

| KR | 10-2019-0026617 | 3/2019 |
| KR | 10-2019-0079283 | 7/2019 |
| WO | 2015/117273 | 8/2015 |
| WO | 2020/072394 | 4/2020 |

\* cited by examiner

//////
DISPLAY APPARATUS

CROSS REFERENCE TO RELATED APPLICATION

This application claims the benefit of U.S. Provisional Patent Application No. 62/958,879 filed on Jan. 9, 2020, which is hereby incorporated by reference for all purposes as if fully set forth herein.

BACKGROUND

Field

Exemplary embodiments of the present invention relate generally to a display apparatus, and more particularly, to a large-area multi-module display apparatus.

Discussion of the Background

A display apparatus employing light emitting diodes (LEDs) has been recently developed. The display apparatus employing light emitting diodes may be manufactured by forming structures of individually grown red (R), green (G) and blue (B) light emitting diodes (LEDs) on a final substrate.

However, demands for a display apparatus having various areas, particularly a large area, are increasing, in addition to a high resolution full-color display apparatus.

The above information disclosed in this Background section is only for understanding of the background of the inventive concepts, and, therefore, it may contain information that does not constitute prior art.

SUMMARY

Exemplary embodiments provide a high quality large-area multi-module display apparatus and a method of manufacturing the same.

Additional features of the inventive concepts will be set forth in the description which follows, and in part will be apparent from the description, or may be learned by practice of the inventive concepts.

A display apparatus according to an exemplary embodiment includes a plurality of display modules each including a module substrate and a plurality of light emitting devices mounted on the module substrate, and a support substrate on which the display modules are disposed and including conductive members, in which the module substrates includes a plurality of recesses depressed from at least one end surface of the module substrate, and connection electrodes formed in the recesses, and the light emitting devices are electrically connected to the conducive members of the support substrate through the connection electrodes.

At least one the module substrates may include a plurality of protrusions on at least one end surface thereof to correspond to the recesses of an adjacent module substrate.

A depressed portion of each of the recesses may have at least one of substantially a triangular shape, substantially a semi-circular shape, and substantially a semi-elliptical shape in plan view.

Each of the module substrates may include the protrusions on at least one end surface thereof.

Each of the recesses may be filled with the connection electrode.

The display apparatus may further include a protection material disposed in the recesses, in which the connection electrode may be disposed between a surface of the recess and the protection material.

The display apparatus may further include a connection wire disposed on an upper surface of the module substrate and connected to the connection electrode, and a back connection wire disposed on a lower surface of the module substrate and connected to the connection electrode, the back connection wire being connected to the support substrate via a ball grid array (BGA) or a conductive bonding member.

The support substrate may include a conductive electrode portion disposed on a surface thereof facing the module substrate, and the connection electrode may contact the conductive electrode portion through the back connection wire.

The number of connection electrodes may correspond to the number of light emitting devices so as to drive the light emitting devices.

The module substrate may include a pixel region in which the light emitting devices are disposed to display an image and a non-pixel region surrounding the pixel region, and at least some of the connection wires may be disposed in the pixel region.

The recesses may be disposed in the non-pixel region.

The recesses may be disposed along an edge of the module substrate.

A method of manufacturing a display apparatus according to another exemplary embodiment includes manufacturing a plurality of display modules each including a module substrate, and disposing the display modules on a support substrate, in which manufacturing each of the display modules includes forming recesses on at least one end surface of the module substrate, forming connection electrodes on the recesses, forming light emitting devices on the module substrate, and forming a drive circuit unit on a lower surface of the module substrate, and electrically connecting the light emitting devices to the drive circuit unit through the connection electrodes.

The recesses may be formed by laser beams.

Forming the connection electrodes may include forming a conductive layer on the at least one end surface of the module substrate on which the recesses are formed, and grinding the at least one end surface of the module substrate to remove the conductive layer in area other than the recesses.

The recesses and the connection electrodes on the module substrates may be formed simultaneously after arranging the module substrates adjacently to each other.

The method may further include forming connection wires and back connection wires on upper and lower surfaces of the module substrate, respectively.

The method may further include forming protrusions on at least one end surface of the module substrate.

The protrusions and recesses of adjacent display modules may be engaged with each other.

The display modules may be disposed on the support substrate by a ball grid array (BGA).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
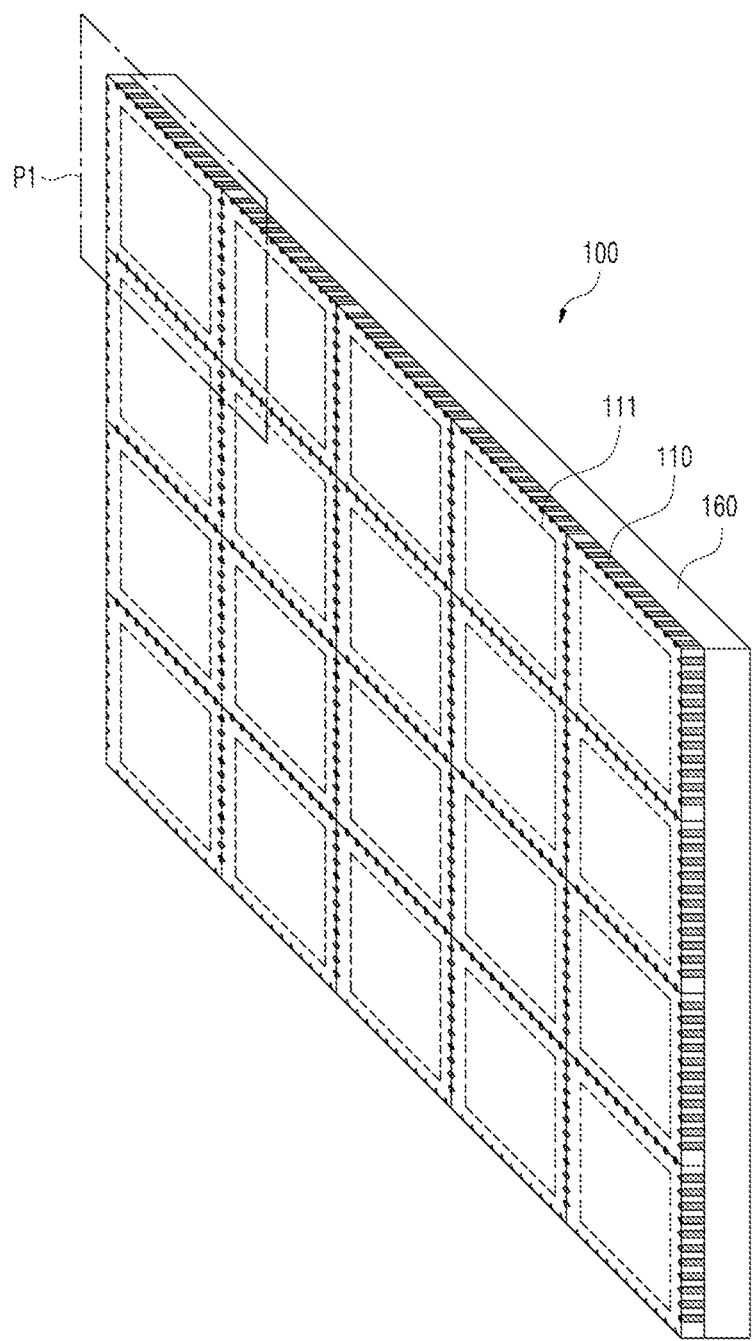
FIG. 1 is a schematic perspective view of a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Exemplary embodiments relate to a display apparatus including pixels. In the display apparatus according to exemplary embodiments, light emitting devices may be used for pixels that display an image. The display apparatus includes televisions, tablets, e-book display apparatuses, computer monitors, kiosks, digital cameras, game consoles, mobile phones, PDAs, vehicular displays, and large outdoor/indoor electronic displays, without being limited thereto.

A display apparatus according to an exemplary embodiment may include micro-light emitting devices. The micro-light emitting devices may have a width or length of about 1 micrometer to about 800 micrometers, a width or length of about 1 micrometer to about 500 micrometers, or a width or length of about 10 micrometers to about 300 micrometers. However, the inventive concepts are not limited thereto, and in some exemplary embodiments, the micro-light emitting devices may have a smaller or larger size as needed. Hereinafter, the micro-light emitting devices will also be referred to as "light emitting devices".

Hereinafter, embodiments of the present disclosure will be described in detail with reference to the accompanying drawings.

Figure 2:
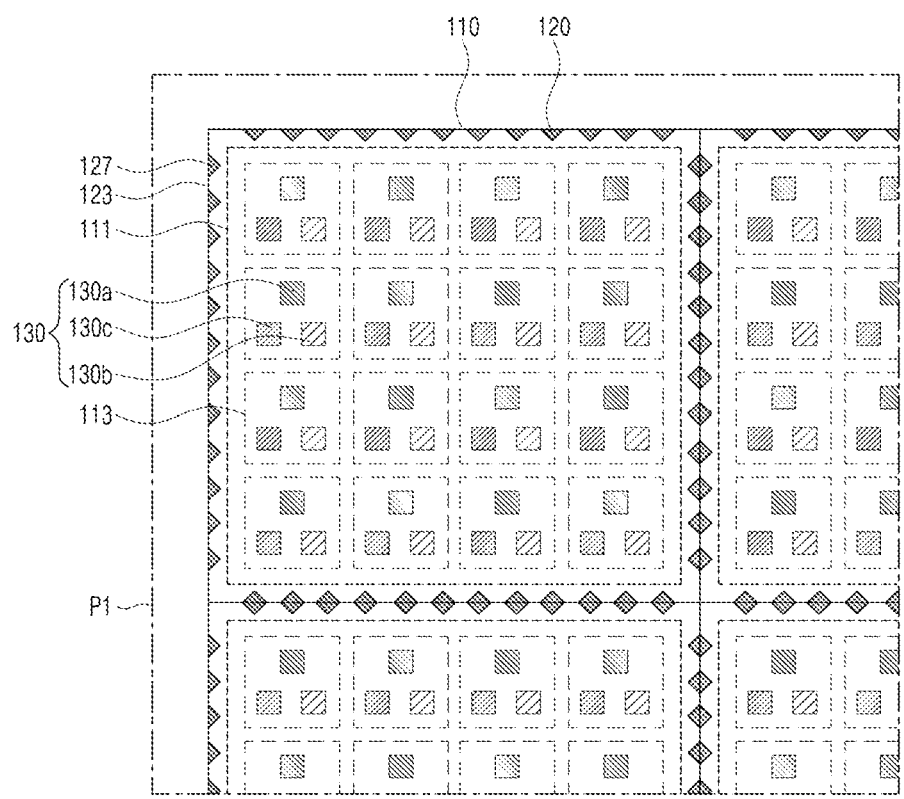
FIG. 2 is an enlarged plan view of Part P1 of FIG. 1.

FIG. 1 is a schematic perspective view of a display apparatus according to an exemplary embodiment. FIG. 2 is an enlarged plan view of Part P1 of FIG. 1.

Figure 3:
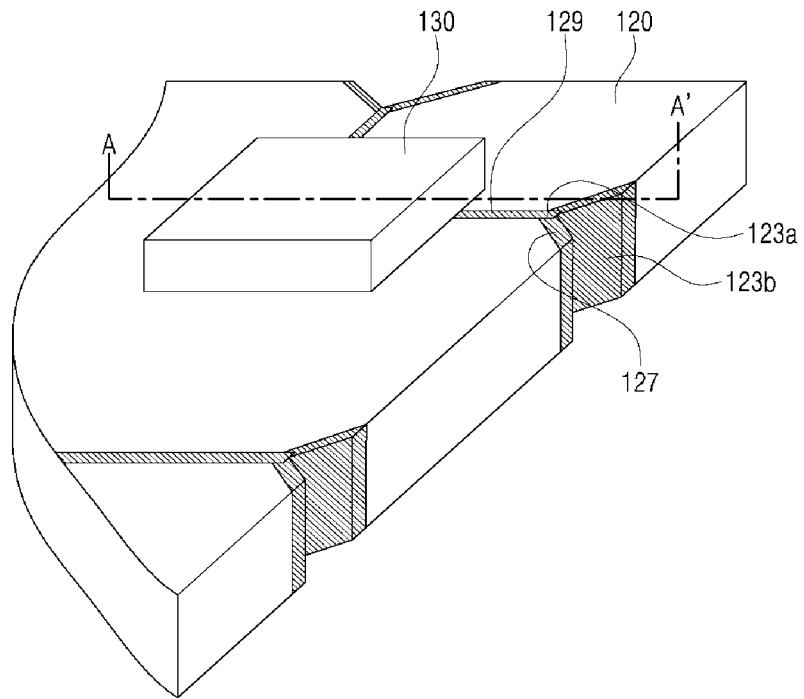
FIG. 3 is a perspective view conceptually illustrating one corner of a display module of a display apparatus according to an exemplary embodiment.
Figure 4A:
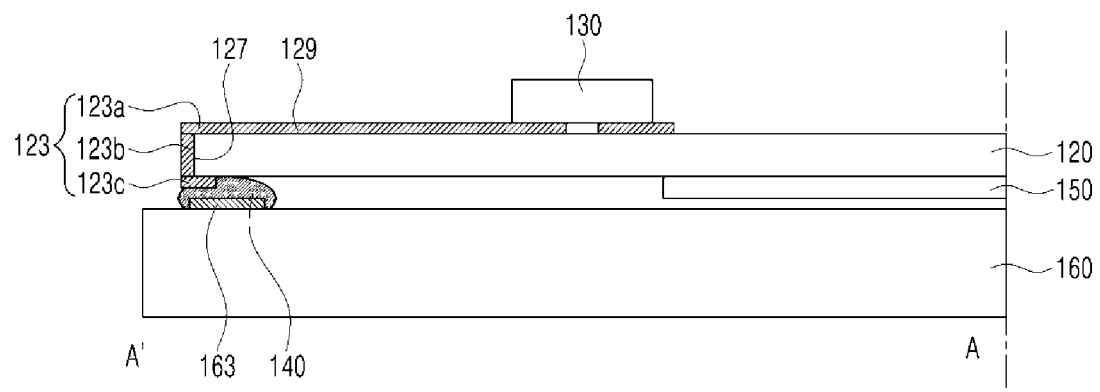
FIG. 4A and FIG. 4B are cross-sectional views taken along line A-A' of FIG. 3 according to exemplary embodiments.
Figure 4B:
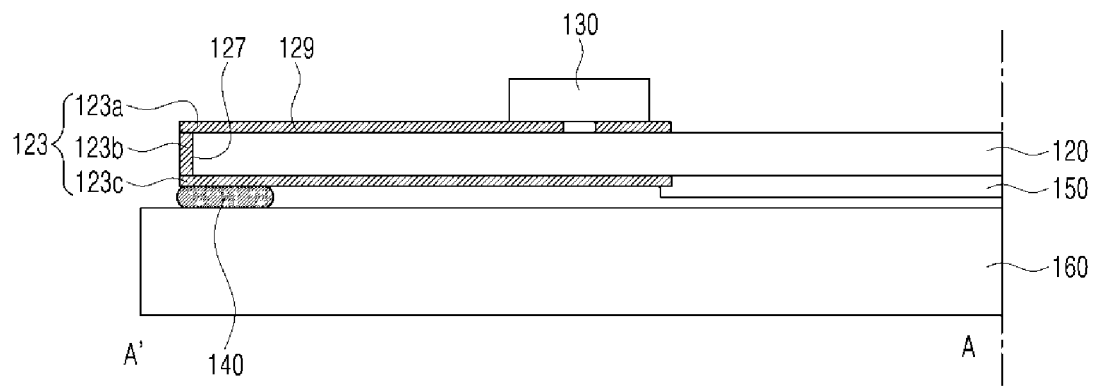

FIG. 3 is a perspective view of one corner of a display module of a display apparatus according to an exemplary embodiment. FIG. 4A and FIG. 4B are cross-sectional views taken along line A-A' of FIG. 3 according to exemplary embodiments.

Referring to FIG. 1 to FIG. 3, FIG. 4A, and FIG. 4B, a display apparatus 100 according to an exemplary embodiment includes a support substrate 160 and multiple display modules 110 disposed on the support substrate 160. Each of the display modules 110 has a pixel region 111 in which an image is displayed, and may be disposed along columns and rows on the support substrate 160. The display module 110 may be formed with at least one pixel, preferably multiple pixels, in the pixel region 111.

The support substrate 160 may be formed with an interconnect portion and light emitting devices 130, and may be robust or flexible. The support substrate 160 may have a larger area than individual display modules 110, such that multiple display modules 110 can be mounted on the support substrate 160. According to the illustrated exemplary embodiment, the display apparatus 100 may have a large display screen through combination of multiple display modules 110.

The support substrate 160 may be formed of, for example, glass, quartz, ceramics, Si, SiC, metals, fibers, polymers, and the like, and may be a transparent or opaque substrate. In addition, the support substrate 160 may be a robust or flexible printed circuit board (PCB).

In an exemplary embodiment, the support substrate 160 may be a transparent substrate, such as glass, quartz, transparent ceramics, a transparent PCB, and the like. The interconnect portion on the support substrate 160 may be formed of a transparent film, such as a transparent conductive oxide film and the like. When the support substrate 160 includes the transparent substrate, the background may be observed through the transparent substrate before the display apparatus is turned on. For example, when the support substrate 160 is attached to a wall and the display apparatus turned off, a display screen of the display apparatus may not be substantially observed while the wall can be observed through the support substrate 160. Since light emitting devices 130 have very small sizes, the background can be observed through regions between the light emitting devices 130. In this manner, a transparent display apparatus, for example, a head-up display, may be provided.

Furthermore, when the support substrate 160 is formed of a flexible plastic material, a flexible display may be provided.

Each of the display modules 110 includes a module substrate 120 and multiple light emitting devices 130 mounted on an upper surface of the module substrate 120.

The module substrate 120 of each of the display modules 110 may be formed of various materials. For example, the module substrate 120 may be formed of a light transmissive insulating material. As used herein, the module substrate 120 having "light transmittance" means not only a module substrate 120 that is transparent to transmit all fractions of light therethrough, but also a module substrate 120 that is translucent or partially transparent to transmit light having a certain wavelength or some fractions of light having a certain wavelength to pass therethrough. The module substrate 120 may include glass, quartz, organic polymer resins, organic/inorganic composites, and the like. However, the inventive concepts are not limited thereto as long as the module substrate 120 has light transmittance and insulating properties.

The module substrate 120 includes at least one pixel region 111 and a non-pixel region surrounding the pixel region 111. The pixel region 111 refers to a region in which a pixel is disposed, and through which light emitted from the light emitting device 130 travels to be viewed by a user. The non-pixel region refers to a region excluding the pixel region 111. The non-pixel region is disposed at one or more sides of the pixel region 111. In the illustrated exemplary embodiment, the non-pixel region surrounds the pixel region 111.

The pixel region 111 is provided with at least one light emitting device 130. According to the illustrated exemplary embodiment, the pixel region 111 is provided with multiple light emitting devices 130.

A pixel unit 113 refers to the smallest unit displaying an image. Each pixel unit 113 may emit white light and/or light of a certain color. Each pixel unit 113 may include one pixel emitting one color, or may include multiple pixels to emit white light and/or light of a certain color through combination of different colors. For example, each of the display modules 110 may include first to third pixels.

The pixels are disposed in the pixel region 111 on the module substrate 120. The pixel unit 113 in each of the display modules 110 is provided with at least one pixel. For example, each of the pixel units 113 may include first to third pixels. The first to third pixels may be realized by first to third light emitting devices 130a, 130b, 130c. When light emitted from the first to third pixels is referred to as first to third light, the first to third light may have different wavelength bands. In an exemplary embodiment, the first to third light may correspond to blue, red, and green wavelength bands, respectively. However, the wavelength bands of light emitted from the pixels included in the display module 110 are not limited thereto, and may correspond to cyan, magenta, and yellow wavelength bands, respectively, in another exemplary embodiment.

The light emitting devices 130 may be provided to each of the pixels to emit light having various wavelengths. In an exemplary embodiment, the light emitting devices 130 may include first to third light emitting devices 130a, 130b, 130c, which emit green, red, and blue light as the first to third light, respectively. In the illustrated exemplary embodiment, the first to third light emitting devices 130a, 130b, 130c may be realized by a blue light emitting diode, a red light emitting diode, and a green light emitting diode, respectively. However, in another exemplary embodiment, the first to third light may have the wavelength bands other than blue, red, and green light to realize a blue color, a red color, and a green color. For example, even when the first to third light has the same wavelength band, a final color of emission light may be controlled using a light conversion layer adapted to convert at least some of the first to third light into light having different wavelength bands from the first to third light. The light conversion layer may include materials, such as phosphors and quantum dots, which can convert light having a certain wavelength into light having a different wavelength. As such, in order to realize the first to third pixels that emit a green color, a red color and/or a blue color, respectively, the light emitting devices 130 may employ other light emitting diodes that the blue light emitting diode, the red light emitting diode, and the green light emitting diode. For example, a red light emitting diode may be used to realize a red color, or a blue or UV light emitting diode and a light conversion layer adapted to emit red light through absorption of blue light or UV light may be used together to realize a red color.

The light emitting devices 130 are formed in minute sizes, and thus, can be mounted on a ductile module substrate, such as a plastic substrate, through a transfer process. The light emitting devices 130 according to an exemplary embodiment may be inorganic light emitting devices, which may be formed through thin film growth of inorganic materials unlike organic light emitting devices. As such, the light emitting devices 130 may be manufactured at high yield through a simple process. Further, individual light emitting diodes 130 that has been divided from a mother substrate can be simultaneously transferred to a large substrate, thereby facilitating manufacture of a large-area display apparatus. Furthermore, the light emitting devices formed of the inorganic materials have advantages over organic light emitting devices, such as higher brightness, longer lifespan, and lower prices.

Referring to FIG. 3, the module substrate 120 includes recesses 127 formed on a side surface and connection electrodes 123 each disposed in the recess 127. The recesses 127 are depressed inwards from the side surface of the module substrate 120 and forms a groove by removing a portion of the side surface of the module substrate 120 from an upper surface of the module substrate 120 towards a lower surface thereof. The connection electrode 123, more specifically, a side electrode 123b of the connection electrode 123, is disposed on the side surface of the module substrate 120 and forms the interior of the recess 127.

An upper pad 123a connected to the side electrode 123b is provided on the upper surface of the module substrate 120, and a lower pad 123c connected to the side electrode 123b is provided on the lower surface of the module substrate 120. The upper pad 123a may contact a connection wire 129 to be connected thereto, or may be integrally formed with the connection wire 129. The connection wire 129 is electrically connected to the light emitting devices 130. The lower pad 123c may contact a lower connection wire 159 (see FIG. 6) to be connected thereto, or may be integrally formed therewith, to thereby be electrically connected to a drive circuit unit or the support substrate. The connection wire 129 and the lower connection wire 159 may include a data line and/or a scan line.

Wires formed on the lower surface of the module substrate 120 may be connected to a separate drive circuit unit 150. For example, referring to FIG. 4A, the drive circuit unit 150 may be a separate printed circuit board disposed on the lower surface of the module substrate 120, and be connected to the wires formed on the lower surface of the module substrate 120. Wires formed on the upper surface of the module substrate 120 may be connected to the wires formed on the lower surface of the module substrate 120 through the connection electrodes 123 disposed on the recesses 127 described below.

In the illustrated exemplary embodiment, the drive circuit unit 150 is manufactured as a separate printed circuit board and is disposed on the lower surface of the module substrate 120. However, the inventive concepts are not limited thereto. In some exemplary embodiments, the display apparatus may further include a separate additional drive circuit unit. The separate additional drive circuit unit may be disposed together with separate wires on the support substrate 160. For example, referring to FIG. 4B, the wires formed on the lower surface of the module substrate 120 may be connected to the support substrate 160.

In an exemplary embodiment, the module substrate 120 may also include drive devices for driving the light emitting devices 130 in addition to the multiple wires. The drive devices may be thin film transistors, for example, each of which may be connected to the corresponding light emitting device 130 to turn on or off the light emitting devices 130 in response to a drive signal from the outside.

As the first to third light emitting device 130a, 130b, 130c, various types of light emitting diodes may be employed.

Figure 5:
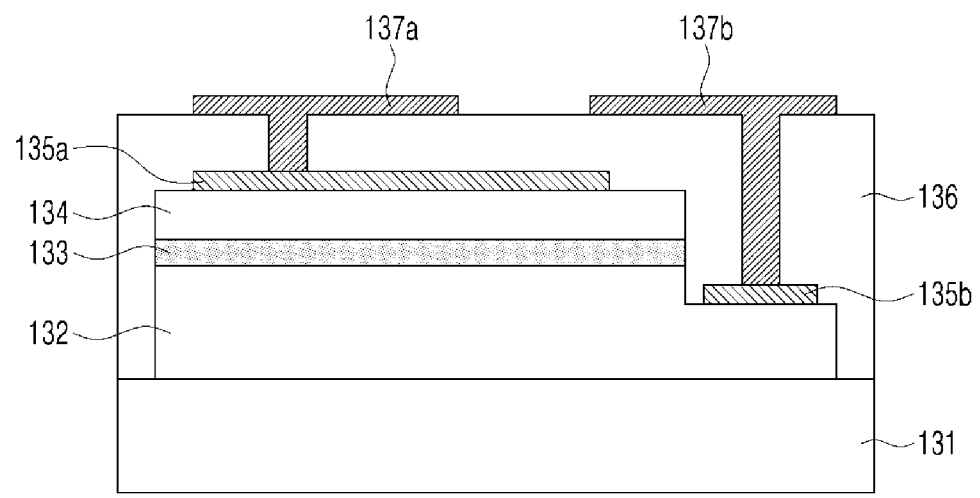
FIG. 5 is a schematic cross-sectional view of a light emitting device according to an exemplary embodiment.

FIG. 5 is a schematic cross-sectional view of the light emitting device 130 according to an exemplary embodiment. The light emitting device 130 shown in FIG. 5 may be one of the first to third light emitting devices 130a, 130b, 130c.

Referring to FIG. 5, the light emitting device includes a device substrate 131, a first semiconductor layer 132, an active layer 133, a second semiconductor layer 134, a first contact electrode 135a, a second contact electrode 135b, an insulating layer 136, a first contact pad 137a, and a second contact pad 137b.

In an exemplary embodiment, for the light emitting device adapted to emit green light, the first semiconductor layer 132, the active layer 133, and the second semiconductor layer 134 may include indium gallium nitride (InGaN), gallium nitride (GaN), aluminum indium gallium nitride (AlInGaN), gallium phosphide (GaP), aluminum gallium indium phosphide (AlGaInP), and aluminum gallium phosphide (AlGaP). In an exemplary embodiment, for the light emitting device adapted to emit red light, the first semiconductor layer 132, the active layer 133, and the second semiconductor layer 134 may include aluminum gallium arsenide (AlGaAs), gallium arsenide phosphide (GaAsP), aluminum gallium indium phosphide (AlGaInP), and gallium phosphide (GaP). In an exemplary embodiment, for the light emitting device adapted to emit blue light, the first semiconductor layer 132, the active layer 133, and the second semiconductor layer 134 may include gallium nitride (GaN), indium gallium nitride (InGaN), aluminum indium gallium nitride (AlInGaN), and zinc selenide (ZnSe).

The first and second semiconductor layers 132, 134 may be doped with different types of dopants, respectively, and may be an n-type semiconductor layer or a p-type semiconductor layer depending upon the type of dopant. For example, the first semiconductor layer 132 may be an n-type semiconductor layer and the second semiconductor layer 134 may be a p-type semiconductor layer. Alternatively, the first semiconductor layer 132 may be a p-type semiconductor layer and the second semiconductor layer 134 may be an n-type semiconductor layer.

Although each of the first semiconductor layer 132 and the second semiconductor layer 134 is exemplarily illustrated as a single layer in the drawings, in some exemplary embodiments, at least one of the first semiconductor layer 132 and the second semiconductor layer 134 may be multiple layers and may include a super-lattice layer. The active layer 133 may have a single quantum well structure or a multi-quantum well structure, and the composition of nitride semiconductors for the active layer 133 may be adjusted to emit light having a desired wavelength.

The first contact electrode 135a is disposed on the first semiconductor layer 132, on which the active layer 133 and the second semiconductor layer 134 are not disposed, and the second contact electrode 135b is disposed on the second semiconductor layer 134.

The first contact electrode 135a and/or the second contact electrode 135b may be formed as a single metallic layer or multiple metallic layers. The first contact electrode 135a and/or the second contact electrode 135b may be formed of various metals, such as Al, Ti, Cr, Ni, Au, Ag, Cu, and the like, and an alloy thereof.

The insulating layer 136 is formed on the first and second contact electrodes 135a, 135b, and the first and second contact pads 137a, 137b are disposed on the insulating layer 136 to be connected to the first contact electrode 135a and the second contact electrode 135b through contact holes, respectively. In the illustrated exemplary embodiment, the first contact pad 137a is connected to the first contact electrode 135a and the second contact pad 137b is connected to the second contact electrode 135b. However, the inventive concepts are not limited thereto. For example, in another exemplary embodiment, the second contact pad 137b may be connected to the first contact electrode 135a and the first contact pad 137a may be connected to the second contact electrode 135b.

The first contact pad 137a and/or the second contact pad 137b may be formed as a single layer or multiple layers. The first contact pad 137a and/or the second contact pad 137b may be formed of various metals, such as Al, Ti, Cr, Ni, Au, and the like, or an alloy thereof.

The light emitting device 130 may further include additional functional layers in addition to the aforementioned layers. For example, in some exemplary embodiments, the light emitting device 130 may further include a reflective layer for reflection of light, an additional insulating layer for insulation of a specific component, an anti-solder layer for preventing diffusion of solders, and the like.

Although the light emitting device 130 shown in FIG. 5 is exemplary illustrated as including the first and second contact pads 137a and 137b facing in an upward direction, in another exemplary embodiment, the light emitting device 130 may be mounted on the module substrate 120 after being flipped upside down such that the first and second contact pads 137a and 137b face the upper surface of the module substrate 120. The first and second contact pads 137a and 137b may be directly electrically connected to the interconnect portion on the module substrate 120, or may be electrically connected thereto through a conductive bonding member.

Referring back to FIG. 1 to FIG. 3, FIG. 4A and FIG. 4B, in the display apparatus 100 according to an exemplary embodiment, the light emitting devices 130 are turned on to emit light upon application of a common voltage and data signals thereto. In this manner, light emitted from the light emitting devices 130 travels towards the lower surface of the module substrate 120 through the module substrate 120 disposed under the light emitting devices 130.

In an exemplary embodiment, each of the display modules 110 is connected to an interconnect portion formed on the upper surface of the support substrate 160, particularly to a conductive electrode portion 163. Various kinds of interconnects and circuits (for example, various circuits for driving the pixels in addition to an additional drive circuit unit) may be formed on the support substrate 160, and drive signals may be provided to the light emitting devices 130 disposed in the display modules 110 through the conductive electrode portion 163. To this end, the module substrate 120 of the display module 110 is provided with a structure for connecting the conductive electrode portion 163 of the support substrate 160 to the interconnect portion 129 on the upper surface of the module substrate 120.

Each of the display modules 110 has a connection structure for connecting the light emitting devices 130 disposed on the upper surface of the module substrate 120 to the drive circuit unit 150 disposed under the module substrate 120, or to the support substrate 160.

Referring back to FIG. 3, at least one end surface of each of the module substrates 120 may include the recesses 127 depressed from the end surface of the module substrate 120. The recesses 127 may be disposed in the non-pixel region, rather than in the pixel region 111, and thus, may be arranged along an edge of the module substrate 120. The number of recesses 127 formed in the module substrate 120 is not particularly limited, but may be set to correspond to the number of light emitting devices 130 to allow connection of the connection wires 129 to the light emitting devices 130.

Each of the recesses 127 is formed by cutting a portion of the side surface of the module substrate 120 from the upper surface of the module substrate 120 to the lower surface thereof. Each of the recesses 127 is provided with the connection electrode 123. Each of the connection electrodes 123 includes the upper pad 123a formed on the upper surface of the module substrate 120, the lower pad 123c formed on the lower surface of the module substrate 120, and the side electrode 123b corresponding to the interior of the recess 127 and connecting the upper pad 123a to the lower pad 123c. The upper pad 123a may be connected to the connection wire 129 formed on the upper surface of the module substrate 120, and the lower pad 123c may be connected to the lower connection wire 159 formed on the lower surface of the module substrate 120, or to the conductive electrode portion 163 of the support substrate 160.

When the drive circuit unit 150 is separately formed on the lower surface of the module substrate 120 to drive the light emitting devices 130 according to the illustrated exemplary embodiment, the lower pad 123c is connected to the drive circuit unit 150 through the connection wire 129 disposed on the lower surface of the module substrate 120.

Figure 6:
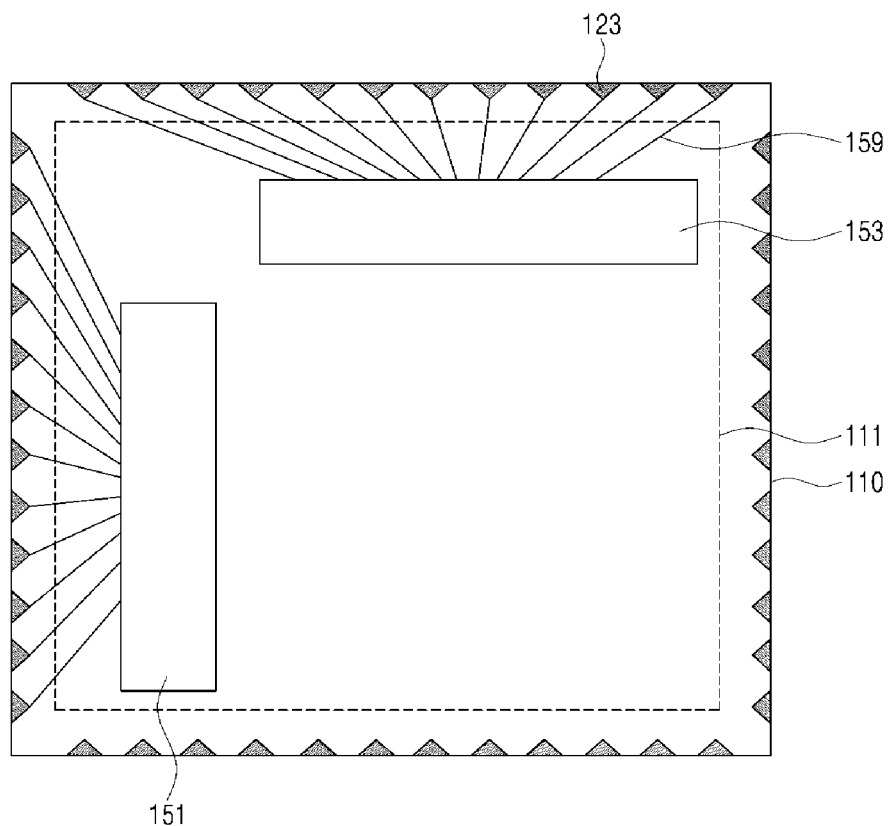
FIG. 6 is a schematic view illustrating a connection relationship on a back surface of a display apparatus according to an exemplary embodiment.

FIG. 6 is a schematic view illustrating a connection relationship on a back surface of the display apparatus 100 according to an exemplary embodiment, in which the separate drive circuit unit 150 is disposed on the lower surface of the module substrate 120.

Referring to FIG. 1 to FIG. 6, the drive circuit unit 150 may be provided singularly or in plural as shown in the drawings. For example, the drive circuit unit 150 may include a first drive circuit unit 151 and a second drive circuit unit 153. The first and second drive circuit units 151, 153 are electrically connected to the lower pads 123c of the connection electrodes 123 through the lower connection wires 159 formed on the lower surface of the module substrate 120. The first drive circuit unit 151 and the second drive circuit unit 153 may be, for example, a scan driver and a data driver, respectively. The first drive circuit unit 151 and the second drive circuit unit 153 may be disposed in regions corresponding to the pixel region 111 and/or the non-pixel region.

When the drive circuit unit 150 is not separately disposed on the lower surface of the module substrate 120, or when the drive circuit unit 150 needs to be connected to an additional device, the lower pad 123c is connected to the conductive electrode portion 163 on the support substrate 160. The lower pad 123c may be connected to the conductive electrode portion 163 of the support substrate 160 through a conductive bonding member 140, such as solder pastes, disposed between the lower pad 123c and the conductive electrode portion 163. Alternatively, the lower pad 123c may be connected to the conductive electrode portion 163 of the support substrate 160 by a ball grid array. In this case, solder balls may be disposed between the lower pad 123c and the conductive electrode portion 163 of the support substrate 160.

The support substrate 160 may be provided with various devices, for example, a timing controller, a memory including an EEPROM, circuits for driving the light emitting device 130 such as a voltage source and the like, and the interconnect portion including various wires electrically connected to the conductive electrode portion 163. The support substrate 160 may be formed with a gate driver and a data driver, which supply scan signals and image signals to a scan line and a data line, respectively.

Drive signals output from the drive circuit unit 150 or from various devices of the support substrate 160 are sent to the light emitting devices 130 through the connection electrodes 123 such that the light emitting devices 130 can be turned on or off to display an image.

As such, the display apparatus 100 according to an exemplary embodiment may be provided as a multi-module display apparatus including multiple display modules 110. For example, FIG. 1 exemplarily shows the display apparatus 100 including 4×5 display modules 110.

In the illustrated exemplary embodiment, each or at least some of the multiple display modules 110 may be independently driven, or at least some of the multiple display modules 110 may be dependently driven in association with the multiple other display modules 110. A single image may be displayed by driving the multiple display modules 110 in association with one another.

Although each of the multiple display modules 110 is exemplarily illustrated as having the same size, the inventive concepts are not limited thereto. In some exemplary embodiments, at least one display module may have a different size from the remaining display modules. Further, in some exemplary embodiments, at least one display module may include a different number of pixels from the remaining display modules, and thus, may have different resolution from the remaining display modules. Furthermore, when all regions of the display apparatus 100 does not require the same resolution, the display apparatus 100 may be manufactured by arranging display modules having different resolutions.

In an exemplary embodiment, each of the display modules 110 may have a shape other than a rectangular shape. In particular, depending on the overall shape of the display apparatus 100, the display modules 110 may have a shape other than a rectangular shape. In addition, the number of support substrates 160 or the number of display modules 110 mounted on the support substrate 160 may be changed in various ways according to the size of the display apparatus 100 to be manufactured.

With this structure, the display apparatus 100 can minimize image division or generation of dark lines on an image displayed on a screen of the display apparatus 100 by minimizing separation of the pixel region between adjacent display modules 110 during manufacture of a large-area multi-module display apparatus. According to an exemplary embodiment, the connection electrodes 123 may be formed on the side of the module substrate 120 on which the light emitting devices 130 are mounted, particularly in the non-pixel region directly adjacent to the pixel region. In this case, a portion formed with the connection electrode 123 corresponds to a portion inwardly depressed from one end surface of the module substrate 120, thereby obviating the need for an additional interconnect structure outside the module substrate 120. Accordingly, the display apparatus 100 according to an exemplary embodiment may obviate a separate device on the side surface of the module substrate 120 for connecting the display module 110 to the support substrate 160, such that a distance between two adjacent display modules 110 can be minimized because a space for mounting the separate device on the side surface of the module substrate 120 may not be necessary.

FIG. 7A to FIG. 7D are plan views illustrating a method of manufacturing the display apparatus according to an exemplary embodiment.

Referring to FIG. 7A to FIG. 7D, the display apparatus 100 according an exemplary embodiment may be manufactured by manufacturing multiple display modules 110 and placing the multiple display modules 110 on a support substrate 160.

First, the step of manufacturing the multiple display modules 110 will be described.

Figure 7A:
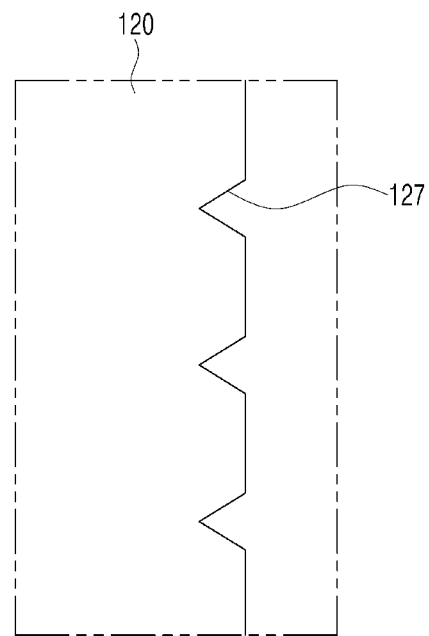
FIG. 7A, FIG. 7B, FIG. 7C, and FIG. 7D are plan views illustrating a method of manufacturing the display apparatus according to an exemplary embodiment.

Referring to FIG. 7A, module substrates 120 are prepared. The module substrates 120 may be formed of a light transmitting insulating material.

Recesses 127 may be formed on at least one end surface of each of the module substrate 120, which may be formed by removing a portion of a side surface of the module substrate 120. The recesses 127 may be formed by partially cutting the side surface of the module substrate 120 using laser beams or a tool, such as a sawtooth and the like. However, the inventive concepts are not limited to a particular method of forming the recesses 127.

Figure 7B:
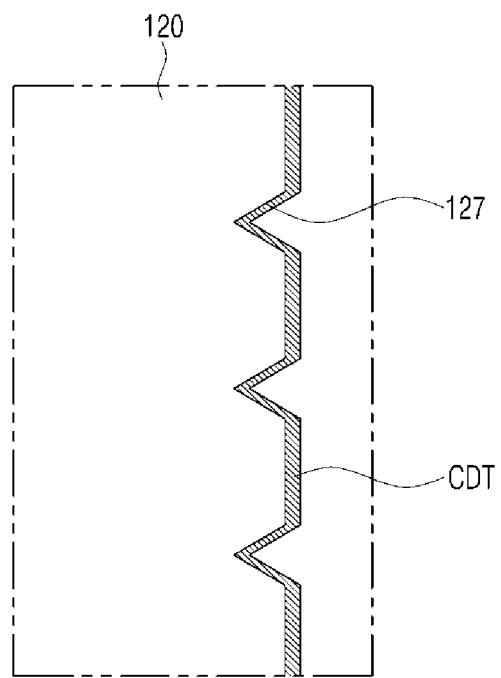

Referring to FIG. 7B, a conductive layer CDT is formed on the side surface of the module substrate 120. The conductive layer CDT may be formed substantially on the entirety of the side surface of the module substrate 120, on which the recesses 127 are formed. The conductive layer CDT may be formed by plating. However, the inventive concepts are not limited thereto, so long as the conductive layer CDT can be formed on the side surface of the module substrate 120.

Figure 7C:
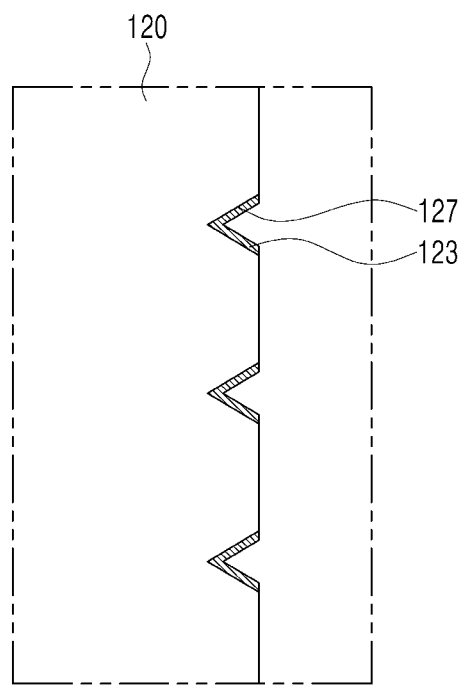

Referring to FIG. 7C, a grinding process may be performed on the at least one end surface of the module substrate 120. By grinding, the conductive layer CDT is removed from the end surface of the module substrate 120 other than that in the recesses 127, such that the conductive layer CDT formed in the recesses 127 is retained to function as connection electrodes, particularly side connection electrodes 123.

Figure 7D:
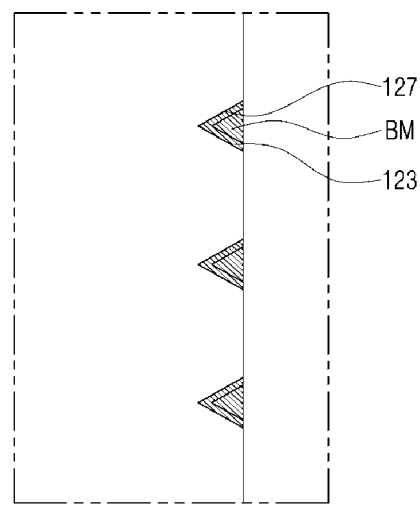

Referring to FIG. 7D, a protection material BM may be formed in the recesses 127 in which the connection electrodes 123 are formed. The protection material BM may be optionally formed in the recesses 127. Alternatively, assembly of the display modules 110 may be performed without forming the protection material BM. The protection material BM may be formed of a black insulating material capable of absorbing light.

Next, light emitting devices 130 are formed on each of the module substrates 120. Before forming the light emitting devices 130, additional connection wires and/or back connection wires may be formed on upper and lower surfaces of the module substrate 120.

A drive circuit unit is prepared and disposed on the lower surface of each of the module substrates 120, and is electrically connected to the light emitting devices 130 through the connection electrodes 123, thereby providing the display modules 110.

Figure 8:
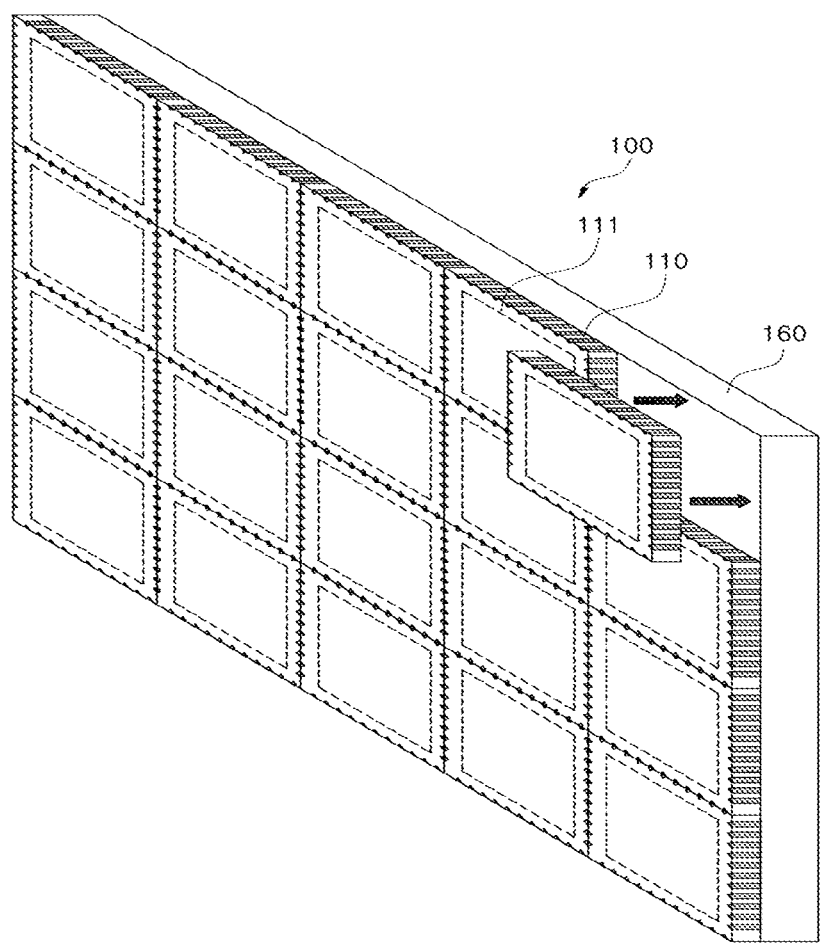
FIG. 8 is a schematic perspective view of an assembly of display modules and a support substrate according to an exemplary embodiment.

FIG. 8 is a schematic perspective view of an assembly of display modules and a support substrate.

Referring to FIG. 8, the display modules 110 formed through the aforementioned processes are disposed on the support substrate 160, and are electrically connected to each other. The multiple modules 110 may be disposed along columns and rows on the support substrate 160. A conductive bonding agent, such as solder pastes, or solder balls for a ball grid array, may be disposed between the display modules 110 and the support substrate 160 to electrically connect the display modules 110 to the support substrate 160.

As described above, each of the display modules 110 is manufactured by simply forming the recesses 127 on the module substrate 120 and the connection electrodes 123 in the recesses 127, followed by attaching the display modules 110 to the support substrate 160 through soldering or a ball grid array, thereby facilitating manufacture of a multi-module display apparatus through an inexpensive and simple process.

The display apparatus according to exemplary embodiments may be manufactured by various methods.

The recesses 127 may be individually formed on a single module substrate 120, or may be simultaneously formed on multiple module substrates 120.

Figure 9:
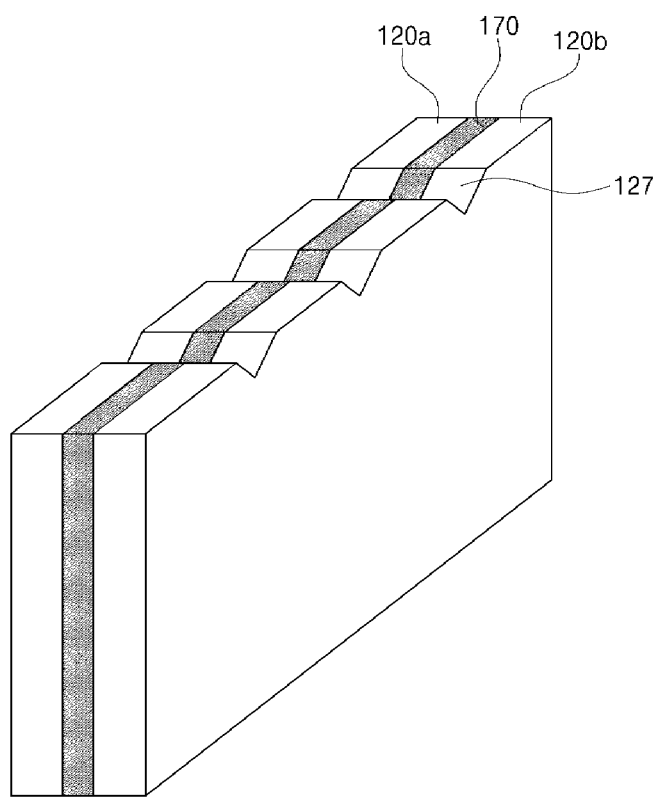
FIG. 9 is a schematic perspective view illustrating a process of simultaneously forming multiple recesses on multiple module substrates.

FIG. 9 is a schematic perspective view illustrating a process of simultaneously forming multiple recesses on multiple module substrates according to an exemplary embodiment. FIG. 9 exemplarily illustrates two module substrates.

Referring to FIG. 9, multiple module substrates 120a, 120b are arranged such that end surfaces of the module substrates 120a, 120b to be formed with the recesses 127 are placed at the same side. In this case, an adhesive sheet 170 may be optionally disposed between two adjacent module substrates 120a, 120b to prevent movement of the module substrates 120a, 120b. Next, with the multiple module substrates 120a, 120b securely arranged next to each other, the recesses 127 may be formed on the end surfaces of the module substrates 120a, 120b by cutting the multiple module substrates 120a, 120b using laser beams or a tool, such as a sawtooth and the like. The module substrates 120a, 120b formed with the recesses 127 may be separated from each other by removing the adhesive sheet 170.

In this manner, the recesses 127 can be easily formed on the multiple module substrates 120a and 120b.

The recess 127 may be formed in various shapes according to exemplary embodiments.

Figure 10:
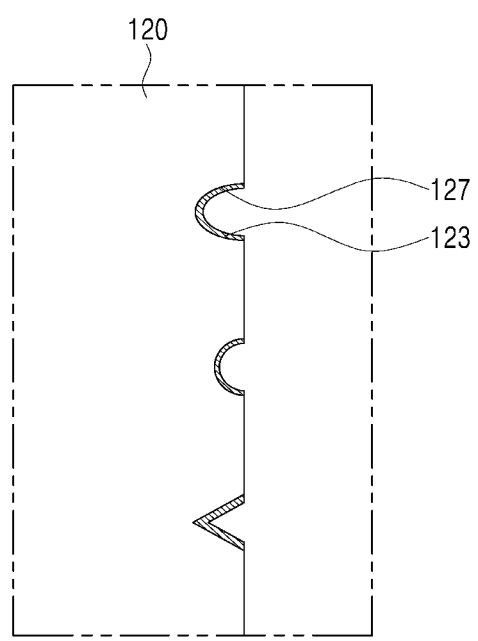
FIG. 10 is a plan view of recesses according to exemplary embodiments.

FIG. 10 is a plan view of recesses according to exemplary embodiment.

Referring to FIG. 10, the recesses 127 have at least one of substantially a triangular shape, substantially a semi-circular shape, and substantially a semi-elliptical shape in plan view. The shape of the recesses 127 is not limited thereto and may be modified into various shapes so long as the recesses 127 are formed in a shape inwardly depressed from one end surface of the module substrate 120. Further, in one module substrate 120, all of the recesses 127 may have the same shape, for example, a triangular shape, without being limited thereto. Alternatively, the recesses 127 having various shapes may be provided to one module substrate 120 and arranged thereon in various ways. Furthermore, the recesses 127 may be arranged at the same interval. However, the inventive concept are not limited thereto, and the distance between the recesses 127 may be variously adjusted as desired.

In some exemplary embodiments, the connection electrodes may be formed in various shapes.

Figure 11:
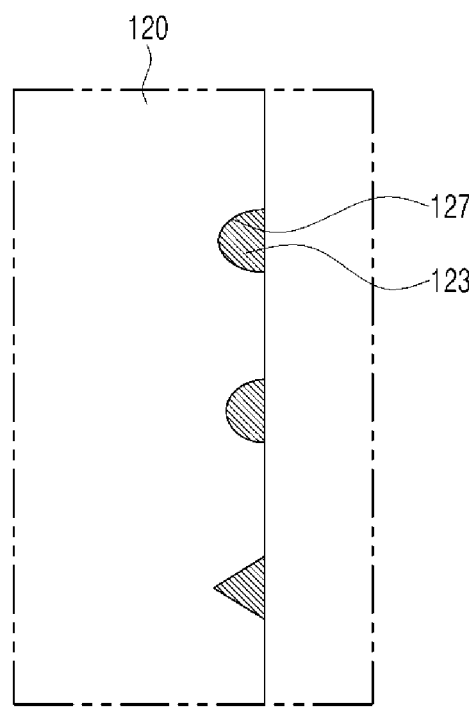
FIG. 11 is a plan view of connection electrodes according to exemplary embodiments.

FIG. 11 is a plan view of connection electrodes according to exemplary embodiments.

Referring to FIG. 11, each of the connection electrodes 123 may be formed to completely fill the recess 127. The connection electrode 123 described above is illustrated as a film conforming to the shape of the recesses 127 with a predetermined thickness. However, the inventive concepts are not limited thereto. As shown in FIG. 11, each of the connection electrodes 123 may completely fill the entirety of a depressed region of the recess 127 along the side surface of the module substrate 120. In the illustrated exemplary embodiment, the connection electrodes 123 may be formed in substantially the same shape as the recesses 127 in plan view.

In an exemplary embodiment, one end surface of the display module 110 may be modified in various shapes to facilitate formation of the connection electrodes 123 or connection of the wires thereon and assembly to the support substrate 160.

Figure 12A:
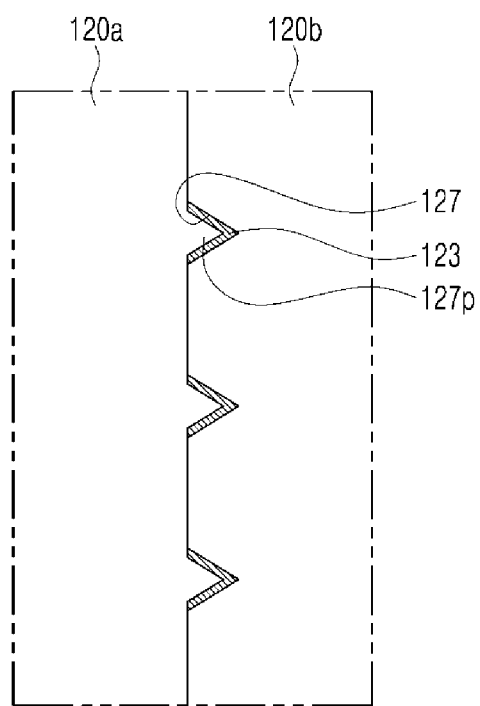
FIG. 12A, FIG. 12B, and FIG. 12C are plan views illustrating two adjacent display modules according to exemplary embodiments.
Figure 12B:
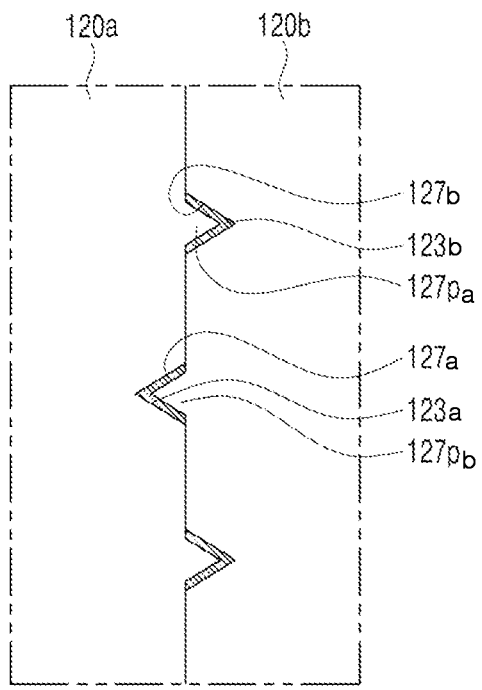
Figure 12C:
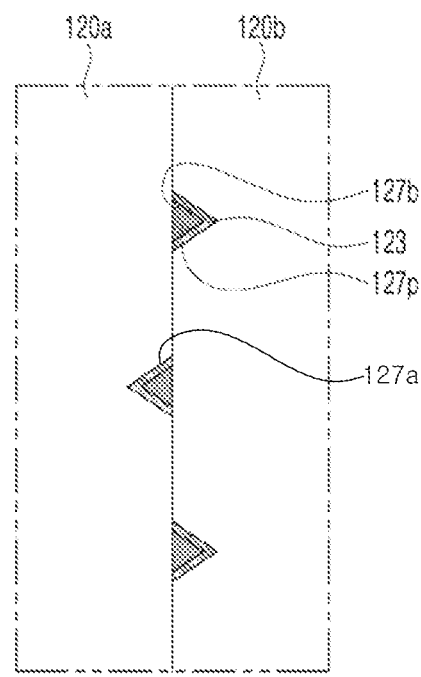

FIG. 12A to FIG. 12C are plan views illustrating two adjacent display modules according to exemplary embodiments.

When two adjacent module substrates among the module substrates on the support substrate 160 are referred to as first and second module substrates 120a, 120b, respectively, at least one of the first and second module substrates 120a, 120b may have multiple recesses formed on at least one end surface thereof, and the other one of the first and second module substrates 120a, 120b may have multiple protrusions formed on at least one end surface thereto to correspond to the multiple recesses.

For example, referring to FIG. 12A, when the first and second module substrates 120a, 120b are disposed at the left and right sides, respectively, the second module substrate 120b at the right side may have recesses 127, each of which is inwardly depressed and formed with a connection electrode 123. The first module substrate 120a at the left side may have protrusions 127p protruding towards the second module substrate 120b. The protrusions 127p of the first module substrate 120a may be formed at locations corresponding to the recesses 127 of the second module substrate 120b and may have a size corresponding to the size of the recesses 127. Accordingly, when the first module substrate 120a is assembled to the second module substrate 120b, the first module substrate 120a and the second module substrate 120b may be arranged such that an edge of the first module substrate 120a engages with the corresponding edge of the second module substrate 120b.

In an exemplary embodiment, the recesses and the protrusions may be disposed on the first and second module substrates in various ways.

For example, referring to FIG. 12B, the first module substrate 120a may have both protrusions 127pa and recesses 127a formed on one end surface thereof. The recesses 127a may be depressed in an inward direction of the first module substrate 120a and connection electrodes 123a may be disposed in the recesses 127a, respectively. The protrusions 127pa may protrude towards the second module substrate 120b. The second module substrate 120b may have the protrusions 127pb in a region corresponding to the recesses 127a of the first module substrate 120a, and recesses 127b in a region corresponding to the protrusions 127pa of the first module substrate 120a. The connection electrodes 123a, 123b may be disposed in the recesses 127a, 127b of the first and second module substrate 120a and 120b, respectively. As such, each of the first and second module substrates 120a, 120b may have the recesses 127a, 127b and the protrusions 127pa, 127pb on at least one end surface thereof.

Referring to FIG. 12C, the recesses 127a of the first module substrate 120a may be disposed to alternate with the recesses 127b of the second module substrate 120b, rather than being disposed corresponding thereto.

In this manner, the display apparatus may be driven in various ways. For example, the pixels may be driven in a passive manner or in an active manner.

Figure 13:
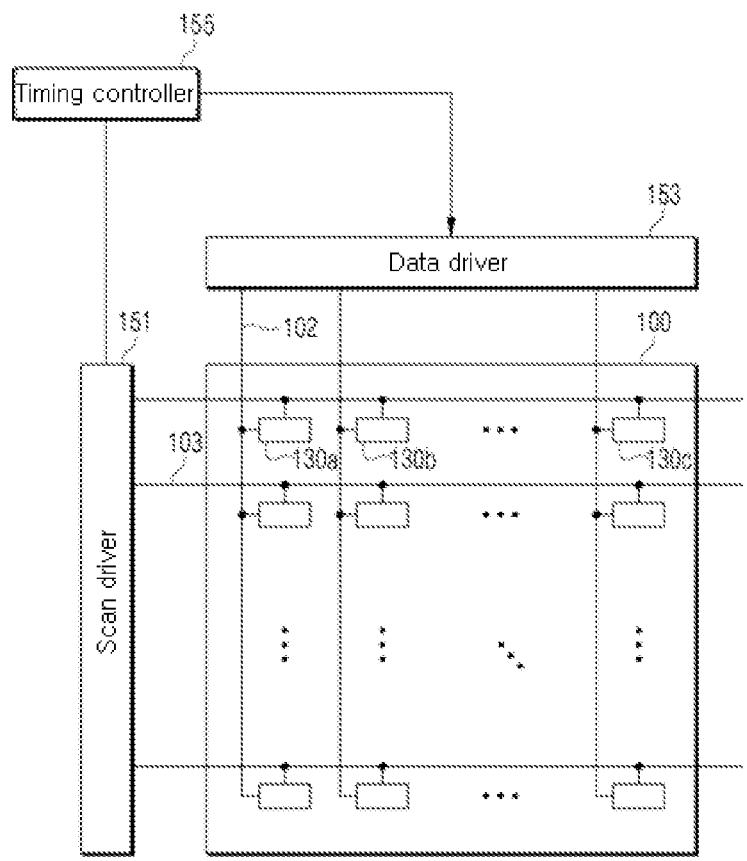
FIG. 13 is a structural view of a display apparatus according to an exemplary embodiment.

FIG. 13 is a structural view of a display apparatus according to an exemplary embodiment.

Referring to FIG. 13, the display apparatus according to an exemplary embodiment includes a timing controller 155, a first driver 151, a second driver 153, an interconnect portion, and pixels realized by the first to third light emitting devices 130a, 130b, 130c. In the illustrated exemplary embodiment, the first driver 151 and the second driver 153 may be a scan driver and a data driver, respectively. Hereinafter, the first driver 151 and the second driver 153 may be referred to as the scan driver and the data driver, respectively.

Each of the pixels is individually connected to the scan driver 151 and the data driver 153 through the interconnect portion.

The timing controller 155 receives image data and various control signals for driving the display apparatus from the outside, such as from a system transmitting the image data. Then, the timing controller 155 sends the image data to the data driver 153 after rearrangement of the received image data. In addition, the timing controller 155 generates scan control signals and data control signals for driving the scan driver 151 and the data driver 153, and sends the scan control signals and the data control signals to the scan driver 151 and the data driver 153, respectively.

The scan driver 151 receives the scan control signals sent from the timing controller 155, and generates scan signals corresponding thereto.

The data driver 153 receives the data control signals and the image data sent from the timing controller 155, and generates data signals corresponding thereto.

The interconnect portion includes multiple signal wires. More particularly, the interconnect portion includes first wires 103, which connect the scan driver 151 to the pixels, and second wires 102, which connect the data driver 153 to the pixels. In the illustrated exemplary embodiment, the first wires 103 may be scan lines and the second wires 102 may be data lines. The interconnect portion may further include wires that connect the timing controller 155 to the scan driver 151, the data driver 153, and other components.

The scan signals generated by the scan driver 151 are sent to the pixels through the scan lines 103. The data signals generated by the data driver 153 are sent to the data lines 102. The data signals sent to the data lines 102 are input to the pixels, in particular, to lines of the display module 110 selected by the scan signals.

The pixels are connected to the scan lines 103 and the data lines 102. The pixels selectively emit light in response to the data signals input through the data lines 102 when the scan signals are supplied from the scan lines 103 to the pixels. For example, in each frame period, each of the pixels emits light at brightness corresponding to the data signal input thereto. In response to data signals corresponding to black brightness, the pixels do not emit light to display a black mode for the corresponding frame period.

In an exemplary embodiment, the light emitting devices may be arranged in various shapes in the pixel region to form a pixel unit.

Figure 14:
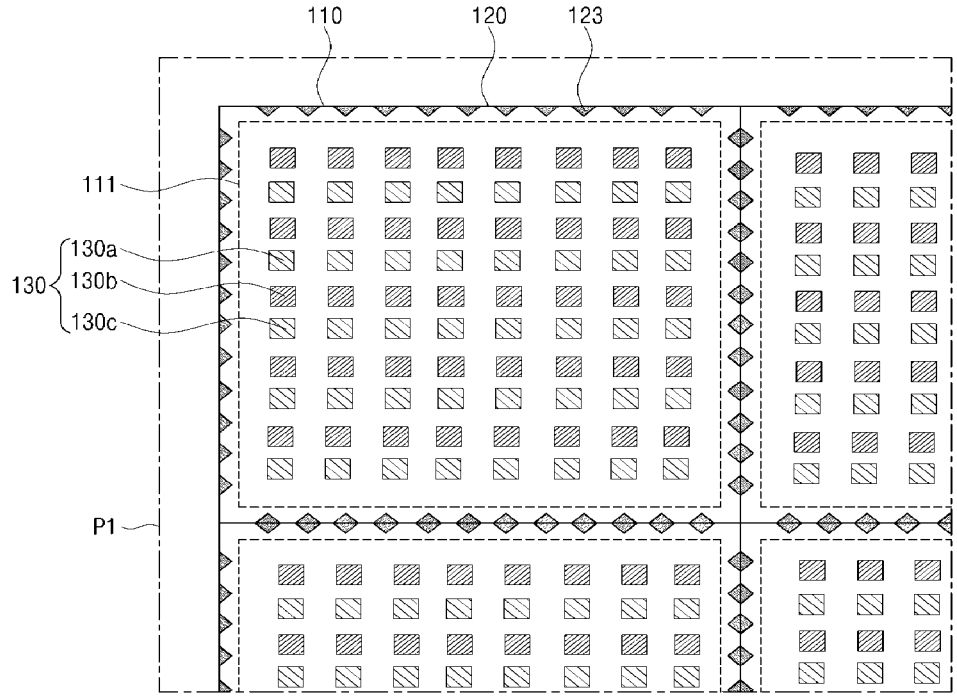
FIG. 14 is an enlarged plan view of Part P1 of FIG. 1 according to another exemplary embodiment.

FIG. 14 is an enlarged plan view of Part P1 of FIG. 1 according to another exemplary embodiment. The Part P1 is substantially the same as that shown in FIG. 2, except that the light emitting devices are disposed in a different arrangement.

Referring to FIG. 14, the pixel region 111 of the module substrate 120 may be provided with the multiple light emitting devices 130. The multiple light emitting devices 130 may be arranged in various shapes to form a pixel unit. Referring back to FIG. 2, one pixel unit is formed by the first to third light emitting devices 130a, 130b, 130c, which are arranged in a triangular shape. According to the illustrated exemplary embodiment, the multiple light emitting devices 130 may be arranged in a matrix, as shown in FIG. 14. For example, when the pixel unit includes the first to third light emitting devices 130a, 130b, 130c, the first to third light emitting devices 130a, 130b, 130c may be alternately arranged along columns or rows, or along both columns and rows. As another example, when the pixel unit includes the first to third light emitting devices 130a, 130b, 130c, the first light emitting devices 130a, the second light emitting devices 130b, and the third light emitting devices 130c may be sequentially repeated along columns or rows, or along both columns and rows.

Figure 15A:
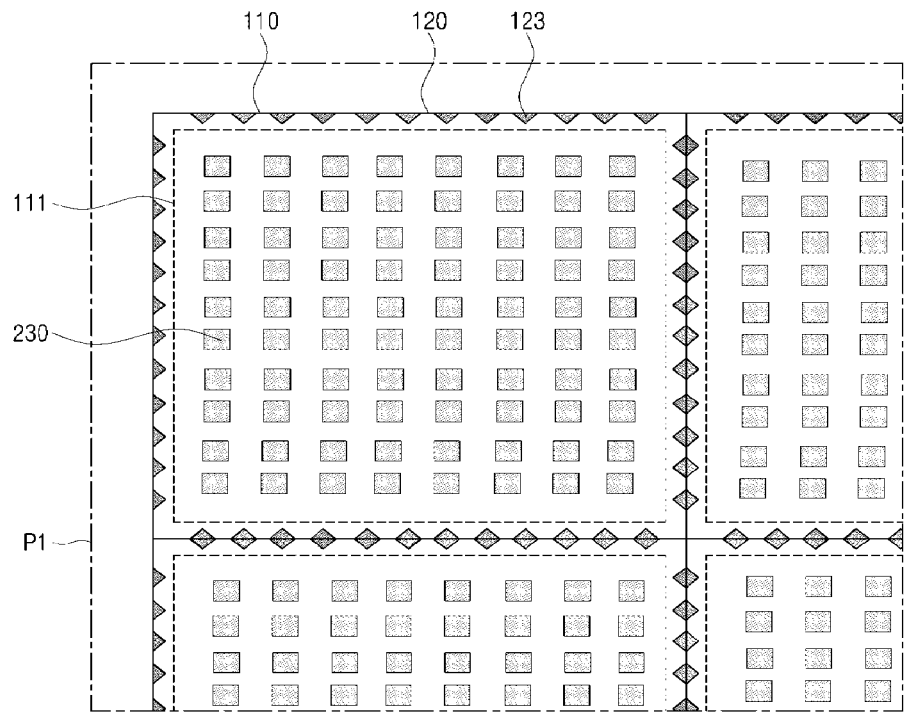
FIG. 15A is an enlarged plan view of Part P1 of FIG. 1 according to another exemplary embodiment.
Figure 15B:
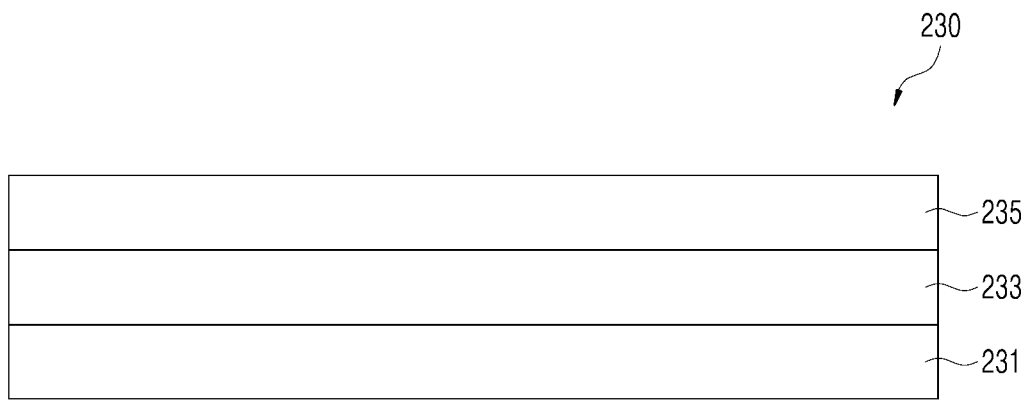
FIG. 15B is a conceptual view of the light emitting device shown in FIG. 15A.

FIG. 15A is an enlarged plan view of Part P1 of FIG. 1 according to another exemplary embodiment. The Part P1 is substantially the same as that shown in FIG. 2, except that the light emitting devices are disposed in a further different arrangement. FIG. 15B is a conceptual view of the light emitting device shown in FIG. 15A.

Referring to FIG. 15A, the pixel region 111 of the module substrate 120 is provided with multiple light emitting devices 230, each of which forms a pixel unit. Each of the light emitting devices 230 may include multiple epitaxial stacks that emit light of different colors. For example, each of the light emitting devices 230 may include first to third epitaxial stacks 231, 233, 235 sequentially stacked one above another, as shown in FIG. 15B.

Each of the epitaxial stacks may emit light of a certain color in the visible spectrum. The first epitaxial stack 231 may emit light of a first color, the second epitaxial stack 233 may emit light of a second color, and the third epitaxial stack 235 may emit light of a third color. The first to third colors are different colors from one another and may have sequentially decreasing wavelengths in different wavelength bands. In particular, the first to third colors may have different short wavelength bands that have gradually increasing energy from the first color to the third color. In the illustrated exemplary embodiment, the first color may be red, the second color may be green, and the third color may be blue. However, the sequence of the first to third colors is not limited thereto, and may be changed depending upon the lamination sequence of the first to third epitaxial stacks 231, 233, 235 in other exemplary embodiments.

As such, since one pixel unit formed through lamination can be formed by mounting only one light emitting stack, rather than using the multiple light emitting devices, more pixel units may be formed in a unit area and the manufacturing method can be significantly simplified.

The display module according to an exemplary embodiment may be provided with an additional component for improving assembly of adjacent module substrates.

Figure 16A:
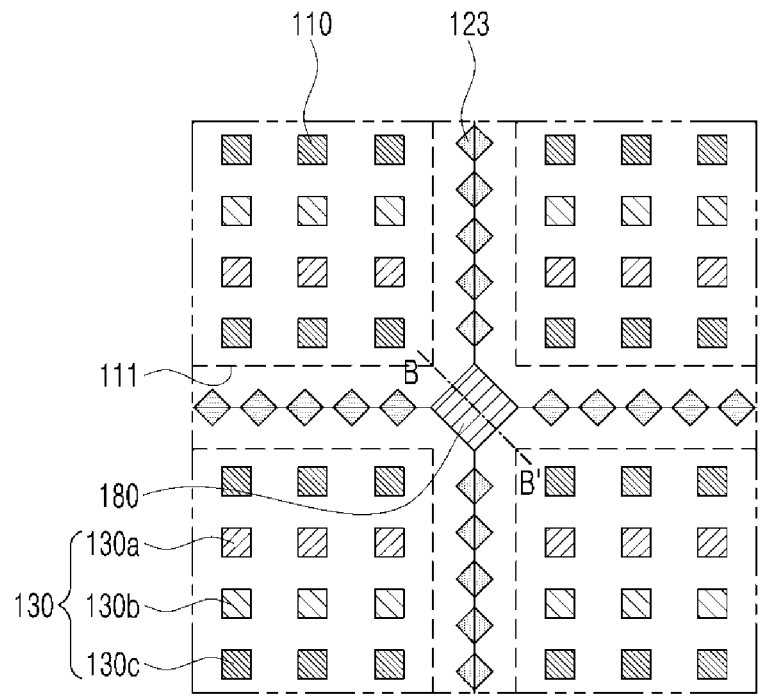
FIG. 16A is a plan view of a portion of a display module according to an exemplary embodiment illustrating a securing member between adjacent module substrates.
Figure 16B:
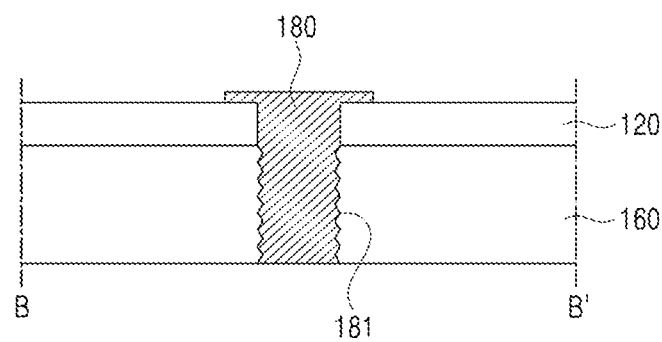
FIG. 16B and FIG. 16C are cross-sectional views taken along line B-B' of FIG. 16A according to exemplary embodiments.
Figure 16C:
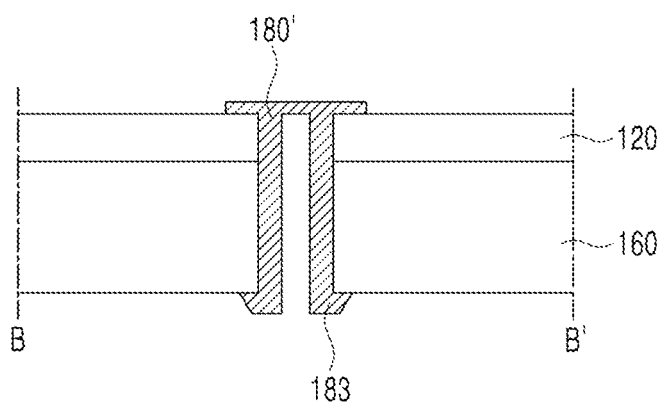

FIG. 16A is a plan view of a portion of a display module according to an exemplary embodiment, illustrating a securing member between adjacent module substrates. FIG. 16B and FIG. 16C are cross-sectional views taken along line B-B' of FIG. 16A according to exemplary embodiments.

Referring to FIG. 16A to FIG. 16C, in the display module according to an exemplary embodiment, at least part of corners of each of the module substrates 120 may be chamfered in various shapes. For example, at least one of four adjacent module substrates 120 may be chamfered in a triangular shape, in a quadrant shape, or in various shapes, in plan view. In an exemplary embodiment, each of four corners of the module substrates 120 facing each other is chamfered in a right-angled triangular shape in plan view.

Since a chamfered portion is removed from the module substrate 120, an empty space is formed in the chamfered portion of the module substrate 120. The empty space of the module substrate 120 may be provided with a securing member 180 to firmly fasten adjacent module substrates 120 to each other. The securing member 180 may have various shapes to secure the module substrates 120 to each other, and may have a black color to prevent reflection or interference of light emitted from each of the light emitting devices 130.

In an exemplary embodiment, the securing member 180 may have substantially a screw shape. When the securing member 180 has substantially the screw shape, the securing member 180 may have threads 181 on an outer surface thereof so as to be inserted into the space of the module substrate 120 and fastened thereto. In this case, the chamfered portion of the module substrate 120 may be formed with threads corresponding to the threads 181 of the securing member 180, and the module substrate 120 may be fastened to the securing member 180 through the threads thereof.

In another exemplary embodiment, the module substrate 120 may be provided with a securing member 180', which may be provided in the form of a resilient hook pin. In the illustrated exemplary embodiment, the securing member 180' may have a latch hook 183, which secures the securing member 180' from the module substrate 120 when inserted into the space of the module substrate 120.

As described above, the securing members are provided in the shapes of the screw or the hook pin. However, the inventive concepts are not limited to a particular shape of the securing member, so long as the securing member can be inserted into the chamfered portion of the module substrate to secure the module substrates.

Embodiments of the present disclosure provide a large-area display apparatus that minimizes division of an image or generation of a dark line on the image.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a plurality of display modules each including a module substrate and a plurality of light emitting devices mounted on the module substrate; and
   a support substrate on which the display modules are disposed and including conductive members,
   wherein:
   the module substrate includes a plurality of recesses depressed from at least one end surface of the module substrate, and connection electrodes formed in the recesses;
   the module substrate further includes a protection insulative material disposed in the recesses, such that the connection electrode is disposed between a surface of the recess and the protection insulative material;

at least a portion of the protection insulative material is exposed to the outside; and each of the light emitting devices is electrically connected to one of the conductive members through at least one of the connection electrodes.

2. The display apparatus according to claim 1, wherein at least one of the module substrates includes a plurality of protrusions on at least one end surface thereof to correspond to the recesses of an adjacent module substrate.

3. The display apparatus according to claim 2, wherein a depressed portion of each of the recesses has at least one of substantially a triangular shape, substantially a semi-circular shape, and substantially a semi-elliptical shape in plan view.

4. The display apparatus according to claim 2, wherein each of the module substrates includes the protrusions on at least one end surface thereof.

5. The display apparatus according to claim 1, wherein each of the recesses is filled with the connection electrode.

6. The display apparatus according to claim 1, further comprising:

a connection wire disposed on an upper surface of the module substrate and connected to the connection electrode; and a back connection wire disposed on a lower surface of the module substrate and connected to the connection electrode, the back connection wire being connected to the support substrate via a ball grid array (BGA) or a conductive bonding member.

7. The display apparatus according to claim 6, wherein the support substrate includes a conductive electrode portion disposed on a surface thereof facing the module substrate, and the connection electrode contacts the conductive electrode portion through the back connection wire.

8. The display apparatus according to claim 1, wherein the number of connection electrodes formed in one module substrate is n times the number of light emitting devices mounted in the one module substrate, n being a positive integer.

9. The display apparatus according to claim 1, wherein the module substrate comprises a pixel region in which the light emitting devices are disposed to display an image and a non-pixel region surrounding the pixel region, and at least some of the connection electrodes are disposed in the pixel region.

10. The display apparatus according to claim 9, wherein the recesses are disposed in the non-pixel region.

11. The display apparatus according to claim 1, wherein the recesses are disposed along an edge of the module substrate.

* * * * *